United States Patent [19]
Hsia et al.

[11] Patent Number: 4,577,391
[45] Date of Patent: Mar. 25, 1986

[54] METHOD OF MANUFACTURING CMOS DEVICES

[75] Inventors: Steve Hsia, Cupertino; Paul Chang, Los Altos, both of Calif.

[73] Assignee: Monolithic Memories, Inc., Santa Clara, Calif.

[21] Appl. No.: 635,371

[22] Filed: Jul. 27, 1984

[51] Int. Cl.[4] .................. H01L 21/265; H01L 21/32
[52] U.S. Cl. ........................................ 29/571; 29/578; 357/23.9; 357/42
[58] Field of Search ............... 29/571, 577 C, 578, 29/579; 148/1.5, 187; 357/23.9, 42

[56] References Cited
U.S. PATENT DOCUMENTS 3,865,654  2/1975  Chang et al. ............... 29/571 X
4,234,362  11/1980  Riseman ...................... 29/571 X
4,397,077  8/1983  Derbenwick et al. ........... 29/571

Primary Examiner—Brian E. Hearn
Assistant Examiner—Alan E. Schiavelli
Attorney, Agent, or Firm—Terrence E. Dooher; Alan H. MacPherson; Steven F. Caserza

[57] ABSTRACT

A CMOS semiconductor structure having insulation sidewall spacers whose width is selected independently for NMOS and PMOS devices. The width of the spacer is selected to reduce hot electron injection in the N channel device and to insure that the gate and source regions are aligned with or underlap the gate in the P channel device. A narrower spacer is used for the P channel device than for the N channel device which permits the formation of a P channel device having a threshold voltage less than 1 volt.

10 Claims, 33 Drawing Figures

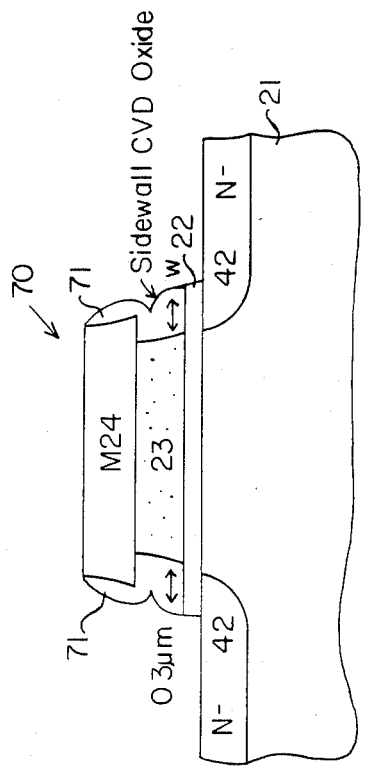
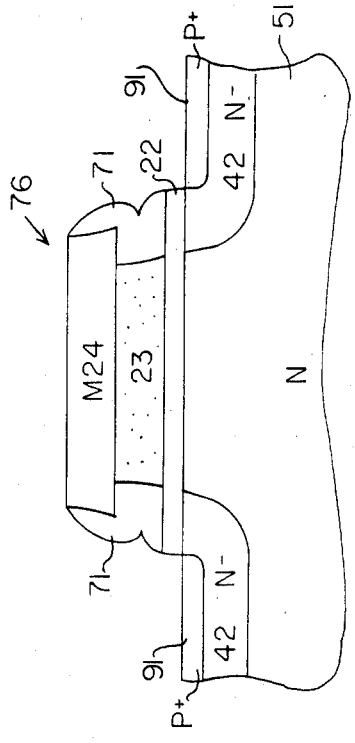
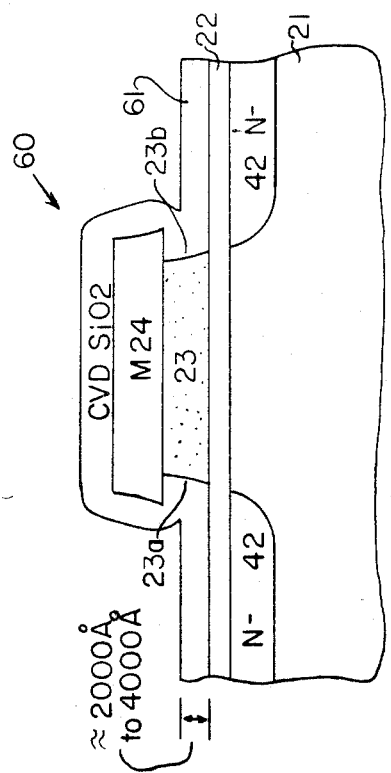
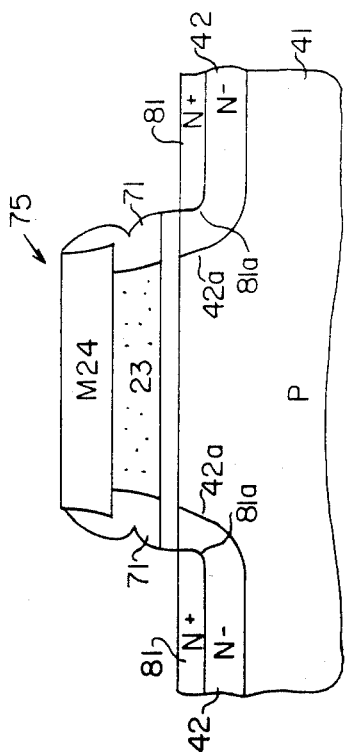

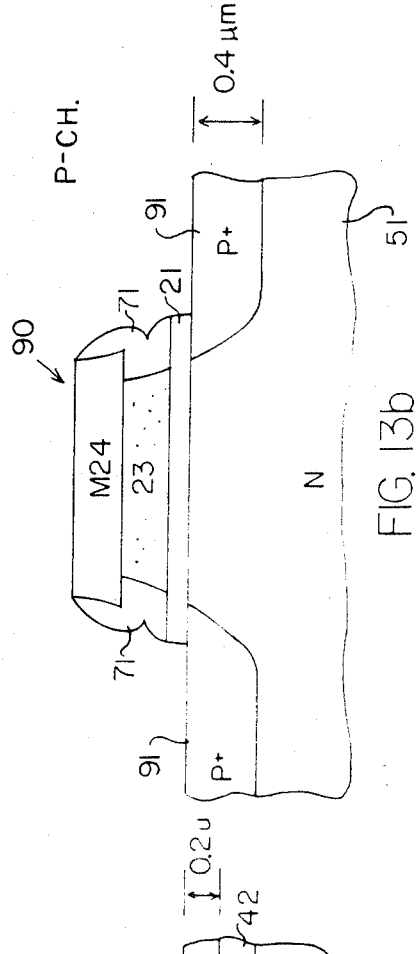
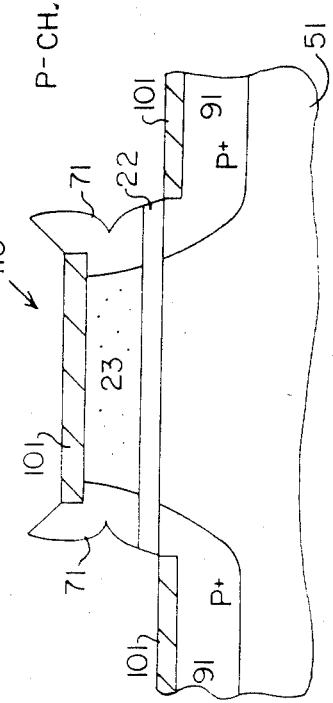
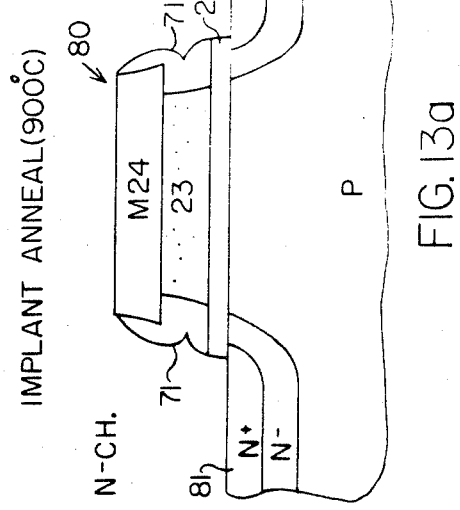
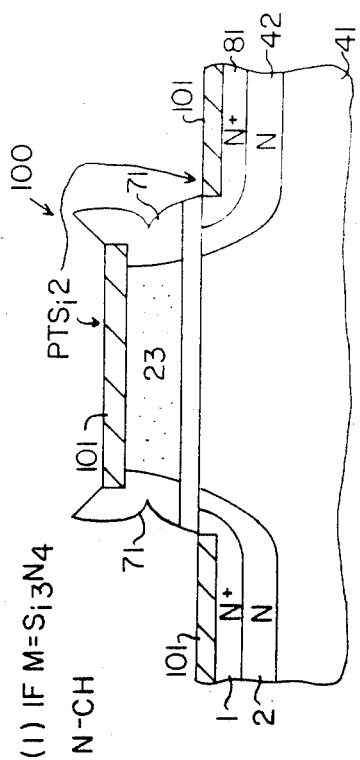

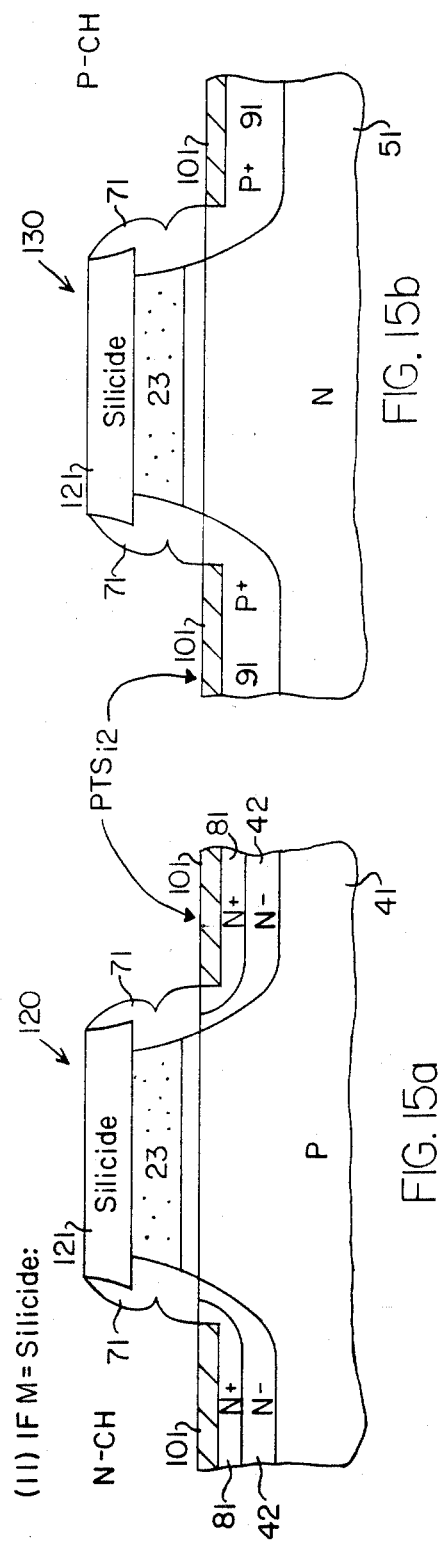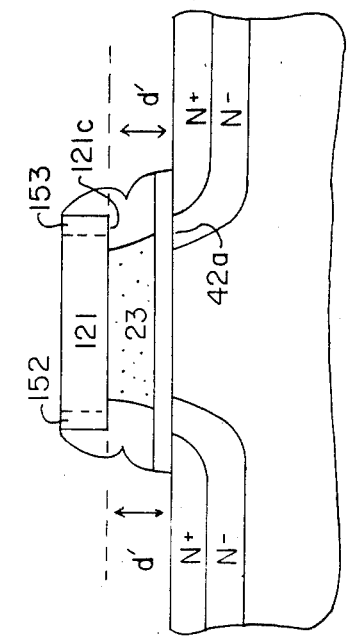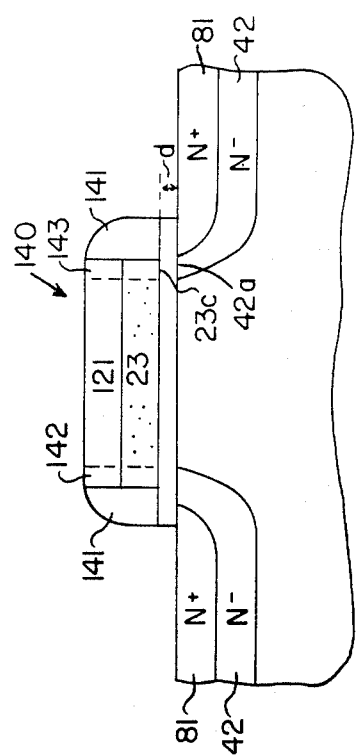

P IMPLANT MASK AND WET CHEMICAL
ETCHING TO REMOVE PORTION OF HTO (2500-3000Å)

RIE ETCH TO CREATE 1000-2000Å SIDEWALL IN PMOS

RESIST STRIP AND GROW IMPLANT OXIDE

METHOD OF MANUFACTURING CMOS DEVICES

FIELD OF THE INVENTION

This invention relates to a complementary metal-oxide semiconductor (CMOS) structure having insulation sidewall spacers. In particular, the invention relates to a CMOS structure (and to the methods of making same) in which the width of the insulation sidewall spacers is selected independently for N channel and P channel devices.

BACKGROUND OF THE INVENTION

Insulation sidewall spacers provide electrical separation between conductive regions in a semiconductor structure. One prior art method of forming insulation sidewall spacers (defined below) is described in U.S. Pat. No. 4,234,362 issued to Riseman on Nov. 18, 1980 which is incorporated herein by reference. In the Riseman method first a semiconductor structure S-1 is formed having "substantially horizontal surfaces" S-2 and "substantially vertical surfaces" S-3 as shown in FIG. 1. A conformal insulation layer S-4 is then formed on the semiconductor structure of FIG. 1 as shown in FIG. 2. Insulation layer S-4 may be one of several insulating materials such as silicon dioxide, silicon nitride, aluminum oxide, or combinations of these materials. Riseman states that the structure shown in FIG. 2 is then placed in a reactive ion etching ambient where the insulation layer S-4 is substantially removed from the horizontal surfaces S-2 without significantly affecting the insulation layer on the vertical regions S-3 in order to produce the vertical insulation regions called the insulation sidewall spacers S-5 shown in FIG. 3. These insulation sidewall spacers S-5 provide electrical separation between conductive regions in the semiconductor structure, for example between N+ emitter region S-6 and polycrystalline silicon regions S-7 shown in FIG. 3. Riseman further states that the desired thickness of insulation sidewall spacers S-5 is the thickness of the conformal insulation layer S-4 on the horizontal surfaces S-2 of semiconductor structure S-1. The thickness of the conformal layer is chosen for device design purposes such as emitter-base separation, and depends on the particular insulator used. Riseman suggests a conformal insulator layer having a thickness between 500 Angstroms and 20,000 Angstroms. A thickness of less than 500 Angstroms may lead to an electrical short circuit between conductive regions.

Later work by Riseman and others shows that the relationship between the thickness of the conformal layer and the thickness (width) of the sidewall spacer is more complex than is stated in the '362 patent. In Abstract No. 233, *Sidewall Spacer Technology*, P. J. Tsang, J. F. Shepard, and J. Riseman, IBM Corporation, Hopewell Junction, N.Y., which is incorporated herein by reference, the authors determined that there are three major factors that affect the final dimension and geometric configuration of an insulation sidewall spacer:

(i) the Chemical Vapor Deposition (CVD) film step coverage, Fsc;

(ii) the etching directionality and etch uniformity of the reactive-ion-etching (RIE) system (the system includes apparatus and etchant gas) used, Fe; and (iii) a geometric factor, which is related to the surface topography of the sample before and after CVD coating, Fg.

*Sidewall Spacer Technology* concentrates on the geometric factor, Fg, since the first two factors, Fsc and Fe, are inherent properties of the deposition and etching reactors and are fixed. FIGS. 4a and 4b illustrate the parameters considered by the authors in formulating their geometric model under the assumptions that:

(i) the CVD is conformal, i.e., the deposited film assumes the shape of the underlying structure;

(ii) the CVD deposition resulted in a rounding of the upper corner of the step with the radius (r) of the curvature being equal to the film thickness (d), and centered at the upper corner of the step (as shown in FIG. 4a) and, (iii) the RIE is anisotropic.

As shown in FIG. 4a, $\phi$ is the angle that the edge of the pattern step makes with the vertical, d is the thickness of the CVD coating, and h is the height of the step. FIG. 4b depicts the width of the spacer formed when the structure of FIG. 4a is subjected to an anisotropic RIE. The width of the spacer is given by the formula $$W = F_{sc} \times F_e \times F_g d.$$

The results reported in *Sidewall Spacer Technology* are reproduced in FIGS. 5a and 5b. An examination of FIGS. 5a and 5b show that unless the aspect ratio $R = h/d$ is kept larger than 1.0 and angle $\phi$ equals zero (i.e. a vertical step) the width w of the sidewall produced will always be smaller than the deposited film thickness, i.e., $(w/d) < 1$. In addition, the variation of the width w caused by uncertainty of R, $\phi$, and overetch Oe will be larger if $R \leq 1.0$ and $\phi \geq 0$. It is suggested in Sidewall Spacer Technology that for most device applications a sidewall spacer having a width w that is as close as possible to the thickness d of the CVD layer is desired. For these purposes a vertical step and an aspect ratio of 1.5 is recommended, so that the width of the spacer is not sensitive to overetch, as shown in FIG. 5a.

Vertical walled polycrystalline silicon gates for MOS devices can be provided with a sidewall oxide spacer or with a multiple sidewall oxide spacer as shown in *New Edge-Defined Vertical-Etch Approaches For Submicrometer MOSFET Fabrication*, W. R. Hunter, T. C. Holloway, P. K. Chatterjee, and A. F. Tasch, Jr., *IEEE-IEDM Tech. Dig.*, pp. 764–67 (1980), which is incorporated herein by reference.

In *Fabrication of High-Performance LDDFETS With Oxide Sidewall-Spacer Technology*, Paul J. Tsang, Seiki Ogura, William W. Walker, Joseph F. Shepard, and Dale L. Critchlow, *IEEE, Electron Devices*, ED-29, pp. 590–96, *April* 1982, which is incorporated herein by reference, a process is described wherein oxide sidewall spacers S-10 are formed at each end of a dual layer gate stack as shown in FIG. 6. The dual layer gate stack S-11 consists of a layer of CVD silicon oxide S-12 deposited on a layer of polycrystalline silion S-13. Gate oxide layer S-14 lies between the gate stack S-11 and the substrate S-15. Reactive ion etching (RIE) is used to etch both the oxide S-12 and the polycrystalline silicon S-13 so that vertical sides of the silicon dioxide/polycrystalline silicon gate stack are obtained before the oxide sidewall spacers are formed.

Of importance, in all of the above prior art techniques for forming an insulating sidewall spacer, it is nowhere disclosed or suggested that such spacers be formed in CMOS devices. In particular, it is not disclosed or suggested that the width of the insulation sidewall spacer be selected independently for NMOS and PMOS devices within a CMOS semiconductor structure.

Another method for forming insulation sidewall spacers is disclosed in copending U.S. patent application Ser. No. 6,595,796 filed Apr. 2, 1984 which is incorporated herein by reference. FIGS. 7 through 11 show one method of forming insulation sidewall spacers according to the teachings described in U.S. patent application Ser. No. 6,595,796.

FIG. 7 shows a semiconductor structure 20 including a silicon substrate 21 which is typically doped with either N type impurities or P type impurities. Substrate 21 is covered by a gate insulating layer 22 (typically silicon oxide or silicon nitride). In one embodiment, insulating layer 22 is a layer of silicon oxide thermally grown at 950° C. in dry oxygen to a thickness of approximately 450 Å. In another embodiment the gate insulating layer of silicon oxide or silicon nitride is formed by well known chemical vapor deposition (CVD). This insulating layer may be alternatively one or a combination of known insulating materials such as oxynitride or the like.

A first layer of polycrystalline silicon 23 is then deposited on the gate oxide layer 22 by low pressure (LP) CVD. Typically polycrystalline silicon 23 is doped, for example with phosphorous or other impurity, in order to increase its conductivity. Typically this doped polycrystalline silicon layer has a thickness between 2000 and 2500 Angstroms (Å).

Second layer 24 of tungsten silicide ($WSi_2$) is deposited on doped polycrystalline silicon layer 23 in a cold wall low pressure CVD reactor. Deposition is done with silane and tungsten hexafluoride diluted with helium at approximately 400° C. Details of this process are described in *Properties of Low Pressure CVD Tungsten Silicide as Related to IC Process Requirements,* Brors, et al., Solid State Technology, pp. 183–86, April 1983, which is incorporated herein by reference. Layer 24 typically has a thickness between 1000 and 2500 Å and is typically an insulating material, a silicide (such as tungsten silicide), or a refractory metal such as tungsten. Second layer 24 may be any material which has a lower etch rate than the underlying doped polycrystalline silicon for a selected etchant.

A layer of photoresist 25 is formed on second layer 24 and patterned by conventional techniques and the resulting structure is anisotropically etched to form structure 20 including multilayer stack 26 as shown in FIG. 7. The anisotropic etch is performed, for example, using plasma $SF_6$. Structure 20 is then subjected to a plasma etch using $CF_4$ or $SF_6$ or a wet etch using $HF:HNO_3:H_2O = 1:60:60$ in order to produce stack 27 shown in FIG. 8. In FIG. 8, second layer 24 is undercut by approximately 1000 to 2,500 Å by the plasma etch or wet etch which etches second layer 24 at a slower rate than doped polycrystalline silicon layer 23. Plasma etchant $CF_4$ or $SF_6$ etches doped polycrystalline silicon layer 23 at a rate approximately twice as fast as second layer 24 when the second layer is tungsten silicide ($WSi_2$)

The process steps described in FIGS. 7 and 8 can, if desired, be combined in a single step plasma etch. In one embodiment of this invention dual stack 27 is produced using a single step planar plasma etching system using $SF_6$ as the main etching species.

Whether stack 27 is formed in one or two etching steps, the amount of undercut is easily controlled due to the known differential etch rates of the selected etchant on second layer 24 and on polycrystalline silicon layer 23. In one embodiment an overhang of approximately 1,200 Å of tungsten silicide is provided by a single step planar plasma etching system using $SF_6$ for approximately 1 minute. The etching characteristics of a dual layer consisting of silicide/polycrystalline-silicon is described in *In Line Plasma Etch of Polysilicon and Molybdenum Silicide using $SF_6$,* P. Chang, et al., Kodak Microelectronics Seminar Proceedings, pp. 9–14, October 1980, which is incorporated herein by reference.

In one embodiment of the invention disclosed in copending U.S. patent application Ser. No. 6,595,796, stack 27 is used to form the gate of an insulated gate field effect transistor (IGFET). The gate stack shown in cross-section is one of many such gate stacks formed in a monolithic block of semiconductor material called a chip. In this embodiment photoresist layer 25 is stripped away using conventional techniques and a low dose (typically $1 \times 10^{13}$ ions/cm$^2$) of phosphorus ions is blanket implanted to form N$^-$ source/drain regions 42 as shown in FIGS. 9a and 9b. N$^-$ source/drain regions 42 are self aligned with the edges 24a and 24b of second layer 24. In those regions of the chip where silicon substrate 21 is doped with a P type dopant (shown as region 41 in FIG. 9a), semiconductor structure 40 is used to construct an N channel device. In those regions of the chip where silicon substrate 21 is doped with a N type dopant (shown as region 51 in FIG. 9b) semiconductor structure 50 is used to construct a P channel device. It is one of the features of one embodiment of the invention disclosed in co-pending U.S. patent application Ser. No. 6,595,796 that the low dose phosphorus ion implant is a blanket implant of the entire chip, which eliminates a traditional masking step. Traditionally a masking layer would be formed over the to-be-formed source/drain regions of N channel transistors during the implantation of low dose phosphorous ions in the source/drain regions of to-be-formed P channel transistors.

The phosphorus ion implant is followed by a high temperature (950° C. to 1000° C.) nitrogen annealing cycle to deepen the N$^-$ drain and source regions 42 to approximately 0.35 microns and to laterally diffuse these regions part way into the channel between them so that the edges of source/drain regions 42 are aligned with the edges 23a and 23b of polycrystalline silicon layer 23 as shown in FIG. 10. The peak dopant concentration in region 42 is then approximately $5 \times 10^{17}$ atoms/cm$^3$. The high temperature annealing cycle also reduces the sheet resistivity of the gate interconnection which comprises polycrystalline silicon layer 23 and silicide layer 24. For example, the sheet resistivity is approximately 2 to 3 ohms/square after 25 minutes of annealing, as compared with approximately 30 ohms/square before annealing. Low resistivity of the gate interconnection is required for the formation of high speed semiconductor devices whose channel width is of the order of 2 microns.

Following the annealing step, a conformal layer 61 of $SiO_2$ approximately 3000 to 5000 Å thick is formed on semiconductor structure 40 (FIG. 9a) or semiconductor structure 50 (FIG. 9b), for example, by chemical vapor deposition, to produce semiconductor structure 60 shown in FIG. 10. In other embodiments conformal layer 24 is silicon nitride, aluminum oxide, or other insulating material, or combinations of the above.

Next, the structure 60 is vertically etched to remove portions of oxide layers 61 and 22 to expose the doped source/drain regions 42 and to form structure 70 having vertical sidewall oxide spacers 71 which fill the regions under the ends of second layer 24 as shown in FIG. 11. The width W of the sidewall oxide spacer 71 as measured near the base of the spacer as shown in FIG. 11 is approximately 0.3 microns. In general the width of an insulation sidewall spacer formed in accordance with the teachings of this invention depends on the thickness of the conformal insulation layer, the differential etch rates of the second layer 24 and the underlying polycrystalline silicon layer 23, the etch time, and the over-etch time. Spacers having a width in the range of about 0.15 mm to 0.4 mm are produced by controlling these variables. The etchant used in one embodiment is $CHF_3:O_2$ which has a high selectivity for etching insulating layer 22 as compared with silicon. For example, when insulating layer 22 is $SiO_2$ the ratio of the etch rates of layer 22 to silicon is about 5:1 and when insulating layer 22 is silicon nitride, the ratio of the etch rates of layer 22 to silicon is about 2.5:1.

For the formation of N channel devices (i.e. where the underlying substrate region 41 is silicon doped with P type impurities), the vertical etching step is followed by an implant of an N type dopant such as arsenic to produce a peak concentration of approximately $1 \times 10^{20}$ atoms/$cm^3$ in the N+ regions 81 in source/drain regions 42 as shown in FIG. 12a. The N+ implant is required to insure good ohmic contact between these regions and later metallization layers (not shown) as described by Grove, *Physics and Technology of Semiconductor Devices*, John Wiley & Sons, (1967) at page 243, which is incorporated herein by reference. Of importance, sidewall spacers 71 at the edges of gate 23 shield from the N+ implants the portions of the N− region which underlies the sidewall spacers. This shielding provides lateral separation between edge 81a of the N+ regions 81 and edge 42a of the N− regions 42, as shown in FIG. 12a. The lateral separation is approximately the thickness of the sidewall spacer and reduces hot electron injection as is explained later.

The structure 74 shown in FIG. 12a is then annealed at a temperature of approximately 920° C. in order to diffuse the N+ source/drain regions 81 to a junction depth of approximately 2000 Å and thus form structure 80 shown in FIG. 13a. The anneal step also causes some lateral diffusion of the N+ regions 81 under the sidewall spacers 71 approximately equal to 85-90% of the vertical junction depth.

For the formation of P channel devices (i.e. where the underlying substrate region 51 is silicon doped with N type impurities), the vertical etching step is followed by an implant of a P type dopant, such as $BF_2$, to produce a peak concentration of approximately $5 \times 10^{19}$ atoms/$cm^3$ in source/drain regions 91 formed in source/drain regions 42 as shown in FIG. 12b. The P type implantation is followed by an implant anneal at a temperature of approximately 920° C. in order to form the P+ regions as shown in FIG. 13b. After annealing, the P+ source/drain regions 91 have a junction depth of approximately 4,000 Å.

The process steps to complete the formation of the P channel and N channel transistors, now depend on the composition of the second layer of the dual stack. For example, if the second layer 24 is silicon nitride $Si_3N_4$, second layer 24 is removed using well known techniques (such as etching with hot phosphoric acid $H_3PO_4$) and a noble metal such as platinum or a refractory metal such as titanium is deposited, which is then sintered to react with the top portion of the polycrystalline silicon layer 23, and with the top portion of N+ and P+ source/drain regions 81 and 91, respectively, to form layer 101 of platinum silicide, PtSi. The unreacted metal is removed using well known wet chemical solution (such as etching platinum with hot aqua regia) to form the P channel and N channel transistors 100 and 110 respectively, as shown in FIG. 14a and 14b.

If the second layer 24 is silicide, second layer 24 is not removed and platinum is deposited on semiconductor structures 80 and 90, shown in FIGS. 13a and 13b, and sintered to react with the top portions of N+ and P+ regions 81 and 91, respectively in order to form platinum silicide layer 101 of transistors 120 and 130 as shown in FIGS. 15a and 15b, respectively.

Transistors formed by the above process, using overhang induced sidewall spacers as exemplified in FIGS. 14a, 14b, 15a, and 15b, have several advantages over transistors with sidewall spacers formed by prior art methods.

First, the width, W, of the oxide spacer 71 (as measured near the bottom of spacer 71 as shown in FIG. 11) is principally controlled using the method of the present invention by controlling the degree of undercutting, which depends on the differential etch rates for second layer 24 and underlying doped polycrystalline silicon layer 23, the etch time, and the over etch time, and the thickness of the conformal oxide layer. The width of the oxide spacer formed by prior art methods depends on the geometric factors described in *Sidewall Spacer Technology* above, including the aspect ratio of the pattern step and the angle that the edge of the pattern step makes with the vertical, as well as the thickness of the CVD layer and over-etch time.

Second, the width, W, of the oxide spacer (as measured near the bottom of the spacer 71) is less sensitive to over etch time of the RIE and to the thickness of the CVD layer 61 than prior art methods as exemplified in *Sidewall Spacer Technology*, above, due to the protective overhang of second layer 24 as shown in FIG. 11.

Third, Miller capacitance is reduced in transistors having sidewall spacers formed according to this invention. This is illustrated in FIGS. 16a and 16b. FIG. 16a shows an N channel transistor 140 formed using prior art sidewall spacers. The Miller capacitance between the right end 143 of the dual stack gate comprising layer 121 and doped polycrystalline layer 23 and the N− region 42 beneath end 143 is inversely proportional to the distance d between the bottom surface 23c of right end 143 and the surface 42a of N− region 42. A parallel statement is true for left end 142. On the other hand, when sidewall spacers 71 are formed in accordance with the present invention, the Miller capacitance between the right end 153 of layer 121 and the N− region 42 beneath end 153 is inversely proportional to the distance d' between the bottom surface 121c of layer 121 and the surface 42a of N− region 42. A parallel statement is true for left end 152 of layer 121. Since d' is greater than d by the thickness of layer 23, Miller capacitance is reduced as compared with the Miller capacitance provided by prior art structures. Of importance, it is neither disclosed nor suggested by Riesman or in co-pending U.S. patent application Ser. No. 6,595,796 that the width of the insulation sidewall spacer be selected independently for NMOS and PMOS devices within a CMOS semiconductor structure.

As explained below, applicants have discovered that certain parameters for NMOS and PMOS devices in a CMOS integrated cirucit can be enhanced by constructing sidewall spacers for NMOS devices having greater width than sidewall spacers for PMOS devices within a CMOS integrated circuit.

SUMMARY

A CMOS semiconductor structure is disclosed having insulation sidewall spacers wherein the width of the spacers is selected independently for NMOS and PMOS devices in the structure. For an N channel device, the width of the spacer is selected to reduce hot electron injection. In the P channel device, a narrower spacer is selected to prevent the gate and source regions from underlapping the gate and to create a small overlap. This permits the formation of P channel devices having a threshold voltage less than approximately one volt.

BRIEF DESCRIPTION OF THE DRAWINGS

FIGS. 7 through 11 show one method of forming insulation sidewall spaces as described in copending U.S. patent application Ser. No. 6,595,796.

FIGS. 12a through 15b show process steps for forming N channel and P channel transistors which include the insulation sidewall spaces of FIG. 11.

FIGS. 16a and 16b show a comparison of prior art sidewall spacers and the spacers formed as described in copending U.S. patent application Ser. No. 6,595,796.

FIG. 18 shows the semiconductor structure of FIG. 17 after N− source/drain blanket ion implant and drive-in.

DETAILED DESCRIPTION

FIGS. 17-25 show one method of forming insulation sidewall spacers in CMOS devices according to the teachings of this invention.

Figure 1:
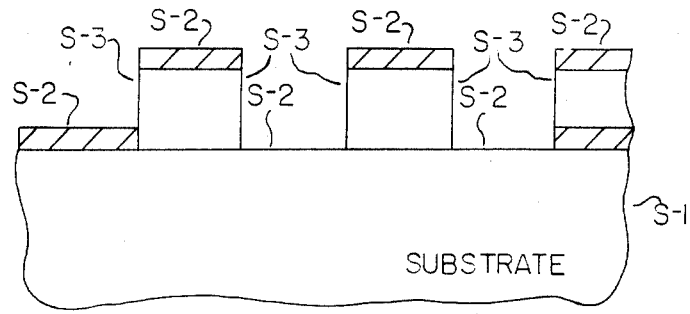
FIG. 1 shows a prior art semiconductor structure having horizontal and vertical surfaces.
Figure 2:
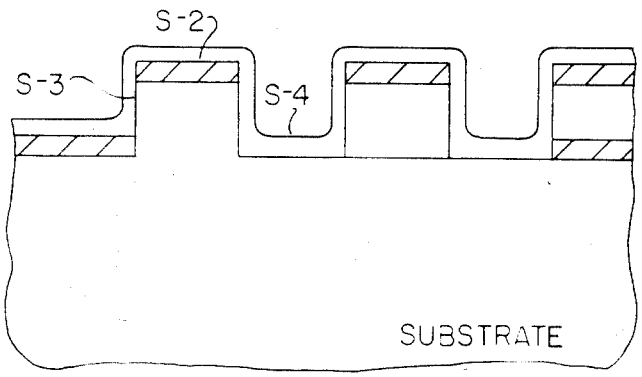
FIG. 2 shows a conformal insulation layer deposited on the structure of FIG. 1.
Figure 3:
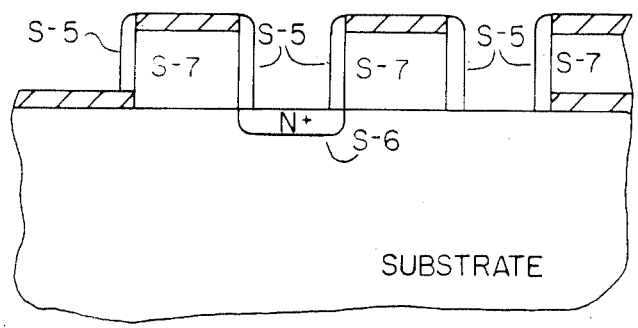
FIG. 3 shows a prior art insulation sidewall spacer.
Figure 4A:
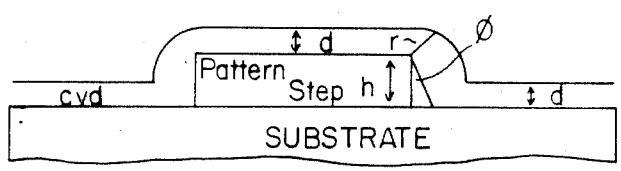
FIG. 4a shows the geometric quantities that determine sidewall spacer width using prior art techniques.
Figure 4B:
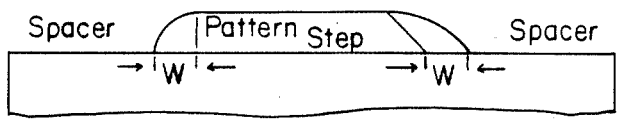
FIG. 4b shows prior art sidewall spacers.
Figure 5A:
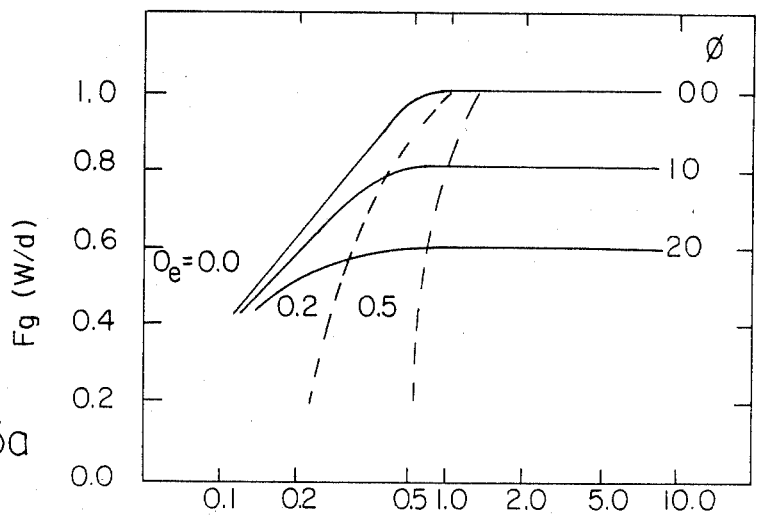
FIG. 5a shows the geometric factor as a function of aspect ratio using the angle between the step edge and the vertical and overetch as parametric variables.
Figure 5B:
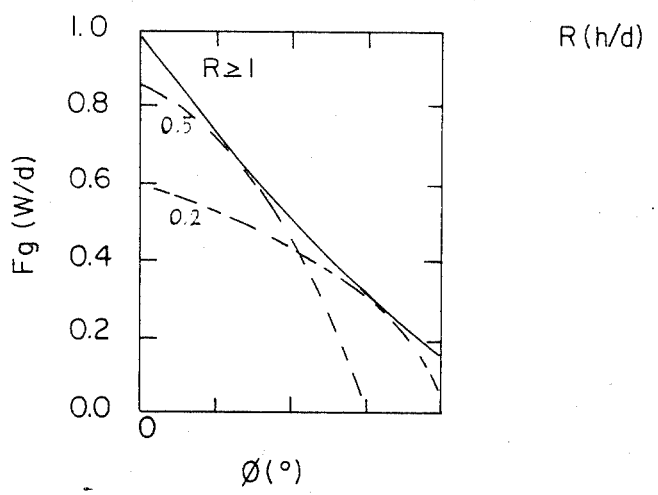
FIG. 5b shows the geometric factor as a function of the angle between the step edge and the vertical using the aspect ratio as a parametric variable.
Figure 6:
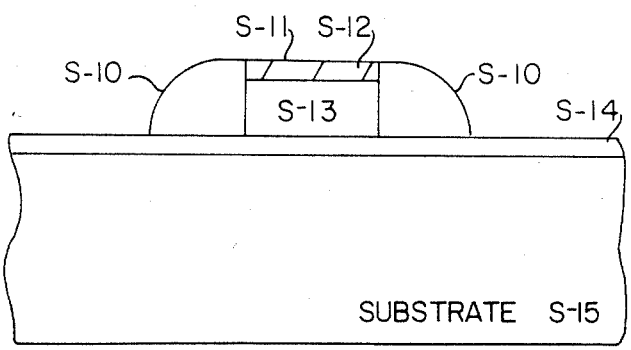
FIG. 6 shows a dual layer gate stack for use in a semiconductor device.
Figure 7:
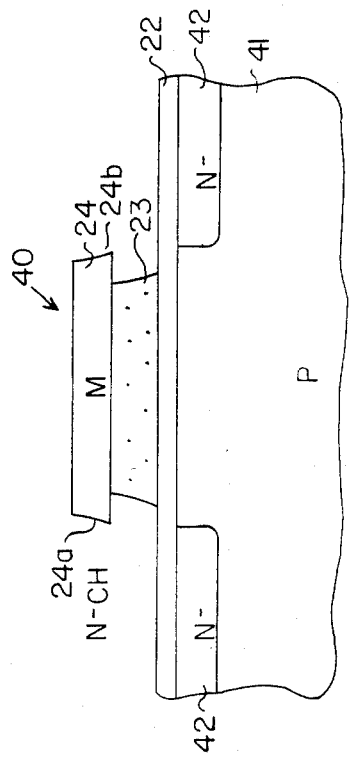
Figure 17:
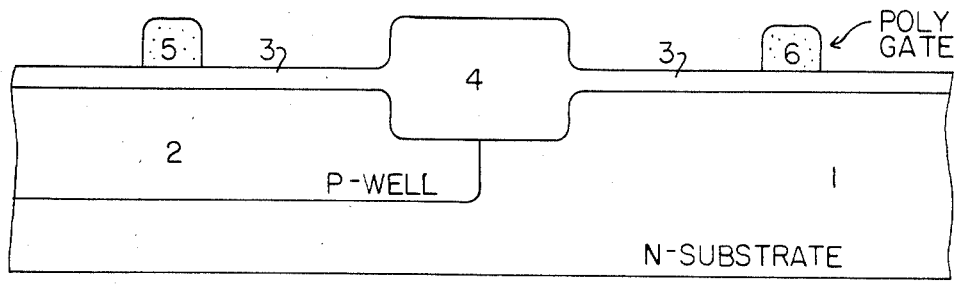
FIG. 17 shows a CMOS semiconductor structure used in the present invention for forming N channel and P channel devices.

FIG. 17 shows a CMOS semiconductor structure including silicon substrate 1 which is doped with N-type impurities. P-well 2 is formed in substrate 1 by techniques well known in the semiconductor arts, for example by ion implantation or diffusion. In one embodiment, Boron is used as the P-type impurity to form P-well 2 having an impurity concentration of approximately $1 \times 10^{16}$ atoms/cm$^3$. The surface of substrate 1 and P-well 2 is covered by gate insulating layer 3. Gate insulating layer 3 is formed as described for gate insulating layer 22 shown in FIG. 7. Field oxide 4 is formed using well known techniques. In one embodiment, gates 5 and 6 are formed from a layer of polycrystalline silicon, which may be either doped or undoped. In other embodiments, gates 5 and 6 are a refractory metal, such as tungsten or molybdenum, or silicide. In still another embodiment, gates 5 and 6 are dual layer gates formed as described above in connection with FIGS. 7-10.

Figure 18:
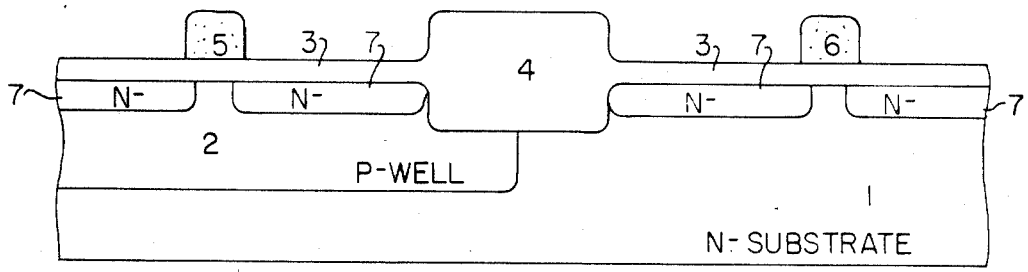

After formation of the gates 5 and 6, a low dose (typically $1 \times 10^{13}$ ions/cm$^2$) of phosphorous ion is blanket implanted to form N− source/drain regions 7 as shown in FIG. 18.

Figure 9A:
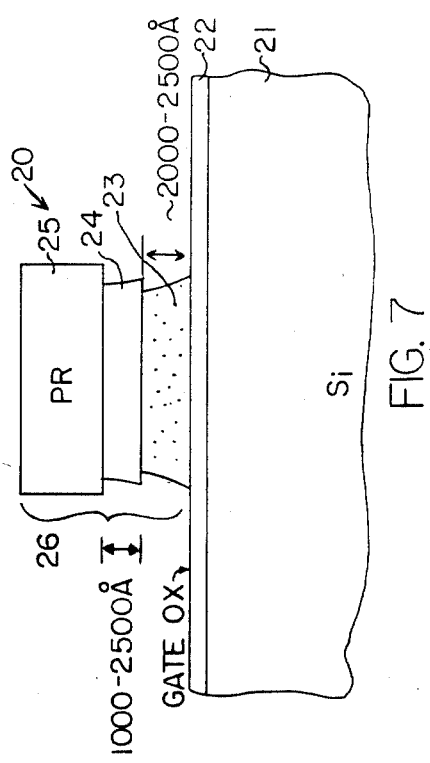
Figure 9B:
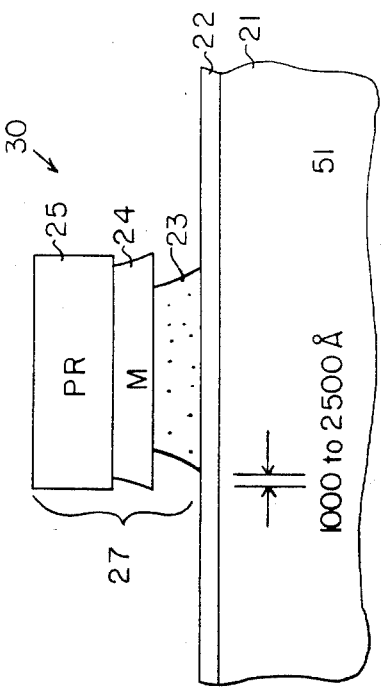

The phosphorus ion implant is followed by a high temperature (950° C. to 1000° C.) nitrogen annealing cycle to deepen source and drain regions 7 to a junction depth of approximately 3,500 Å. In those embodiments where the gate or gate stack dual layer has vertical sides as shown in FIG. 18, lateral diffusion of N type dopants during the nitrogen anneal also causes each source/drain region 7 to overlap the gates 5 and 6 by approximately 2,500 Å per side. In those embodiments that have dual layer gate stacks as shown in FIG. 9a and 9b, the source/drain regions 7 are aligned with the polysilicon layer 23 by the nitrogen anneal.

Figure 19:
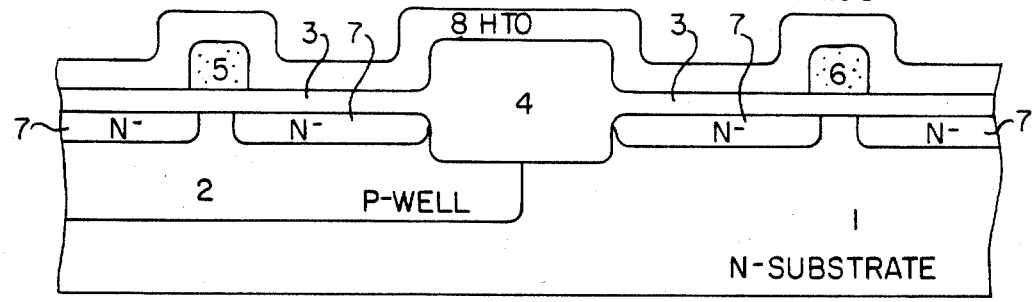
FIG. 19 shows the semiconductor structure of FIG. 18 after HTO deposition.

After the nitrogen anneal, a conformal layer 8 of high temperature oxide (HTO) is formed on the semiconductor structure, as shown in FIG. 19, for example, by chemical vapor deposition at approximately 920° C. to a thickness of approximately 4000 Å to 5000 Å. The high temperature used to form oxide 8 insures good oxide quality and good conformality. In other embodiments, conformal layer 8 is silicon nitride, aluminum oxide, or other insulating material or combinations of the above.

A first photoresist mask 9 (shown in FIG. 20) is then formed over selected portions of the conformal layer 8 which exposes that portion of conformal layer 8 which overlies the field and active regions of to-be-formed PMOS devices. A wet chemical etch, for example, an isotropic buffered oxide etch using HF+H$_2$O+CH$_3$COOH, is then applied to the resulting structure in order to remove a portion of the exposed conformal layer 8 to produce a conformal oxide layer 10 approximately 2000 Å in thickness as shown in FIG. 20.

Figure 8:
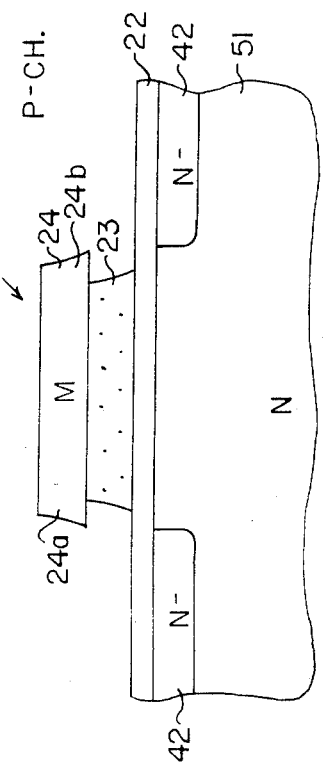
Figure 20:
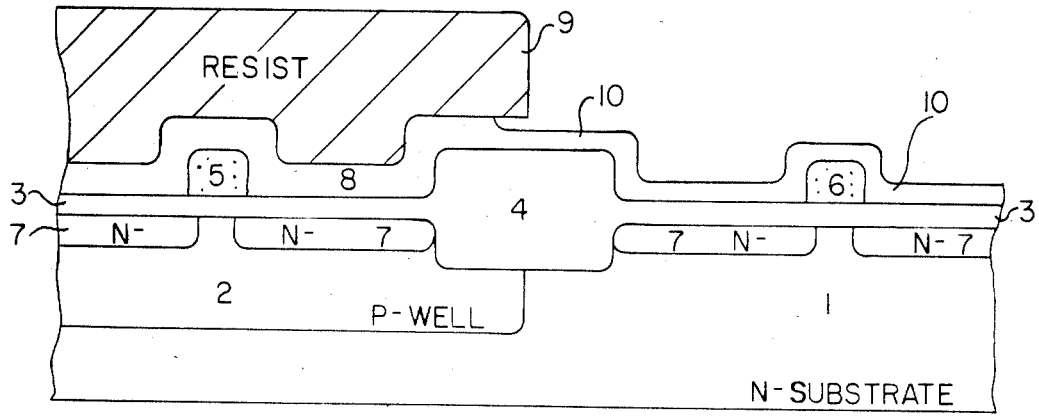
FIG. 20 shows the semiconductor structure of FIG. 18 after formation of P+ implant mask and partial removal of HTO deposition.
Figure 21:
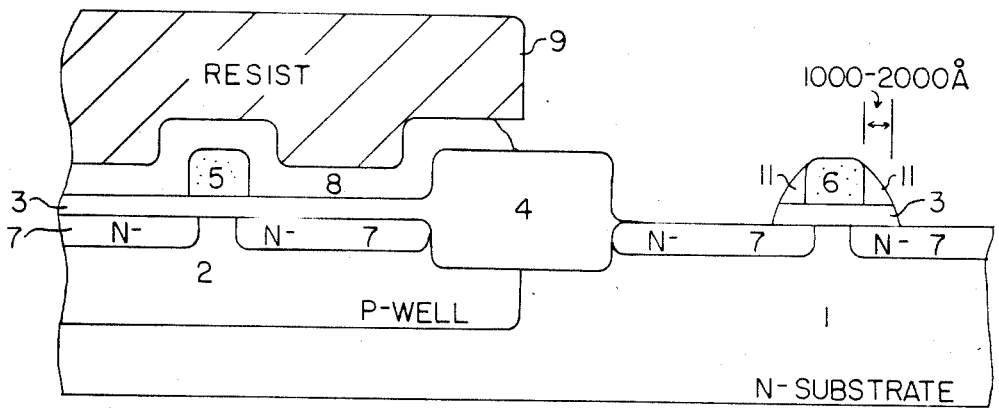
FIG. 21 shows the semiconductor structure of FIG. 20 after formation of thin sidewall for to-be-formed PMOS device.

The structure shown in FIG. 20 is then subjected to a vertical reactive ion etch (RIE) which removes the remaining exposed portions of conformal layer 10 except for the sidewalls 11 which abutt the ends of the gate 6 as shown in FIG. 21. In one embodiment, the etchant used is CHF$_3$:O$_2$ which has a high selectivity for etching insulating layer 10 as compared with silicon. The sidewalls 11 formed by the above process in the regions of the integrated circuit where P-channel devices are to be formed are approximately 1000 Å to 2000 Å thick at their base, as shown in FIG. 21. In those embodiments where the gate stack is a dual layer gate stack, as shown in FIG. 8, the sidewalls are approximately 0.3 microns thick at their base as shown in FIG. 11.

Figure 22:
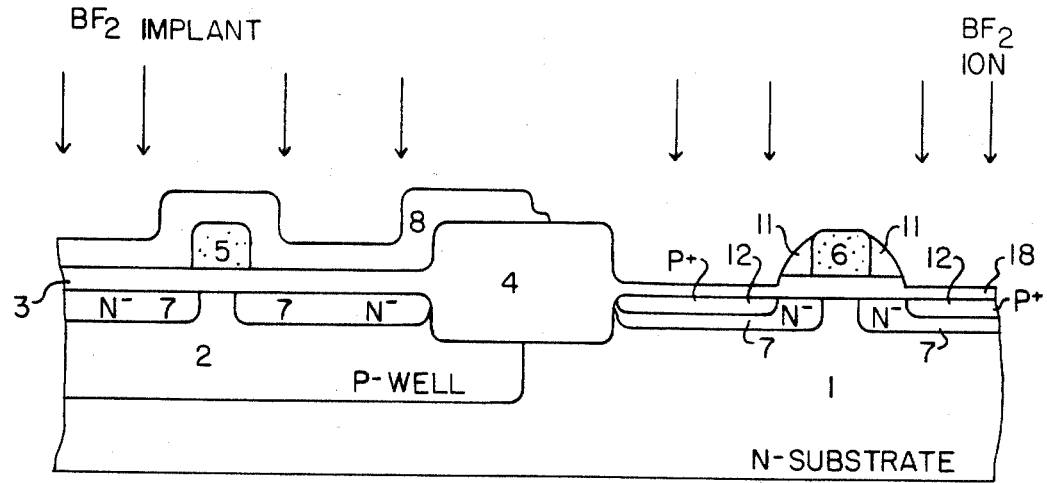
FIG. 22 shows the semiconductor structure of FIG. 21 after removal of P+ implant mask, formation of implant oxide, and P+ source/drain ion implant.

Following formation of sidewall spacers 11, photoresist mask 9 is removed using techniques well known in the semiconductor art and a thin layer 18 of implant oxide approximately 125 Å thick is formed over P channel source/drain regions 7 in order to facilitate the resist stripping after N+ implant. This oxide also prevents contamination during P+ implantation. The $BF_2$ implantation produces a peak concentration of approximately $5 \times 10^{19}$ atoms/cm$^3$ in P+ source and drain regions 12 for a to-be-formed P channel device as shown in FIG. 22. The implant is performed using approximately 80 KEV.

Figure 23:
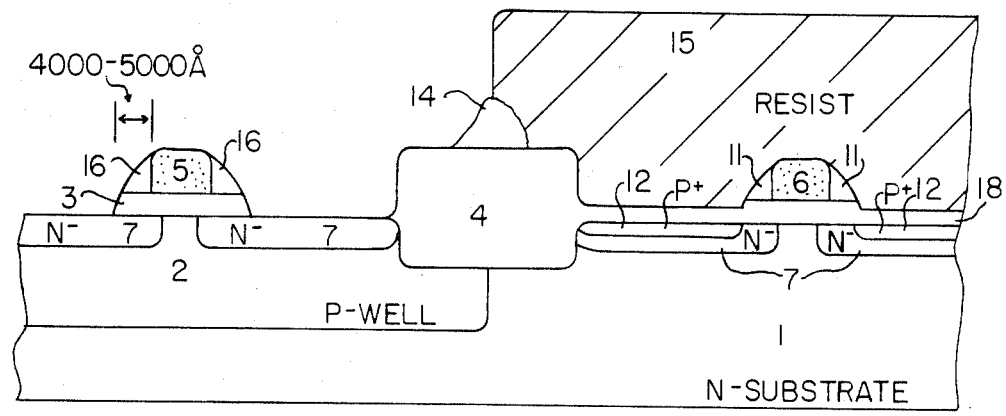
FIG. 23 shows the semiconductor structure of FIG. 22 after formation of N+ implant mask and formation of thick sidewall for to-be-formed NMOS device.

Following the $BF_2$ implant, a second photoresist mask 15 is formed over selected portions of the semiconductor structure in order to expose the portion of conformal layer 8 which overlies the field and active regions of to-be-formed N-MOS devices as shown in FIG. 23.

A second vertical RIE is performed using $CHF_3:O_2$ in order to form relatively thick sidewall spacers 16 having a width at their base of approximately 0.4 to 0.5 microns as shown in FIG. 23. The second vertical etch removes that portion of the gate oxide 3 not protected by the gate 5 or sidewalls 16. In those embodiments where the gate stack is a dual layer gate stack as shown in FIG. 8, the sidewall spacers 16 have a width at their base of approximately 4000 to 5000 Å. Source/drain regions 17 are then formed in selected portions of source/drain regions 7 by implanting an N type dopant such as arsenic to produce a peak concentration of approximately $1 \times 10^{20}$ atoms/cm$^3$ in N+ source/drain regions 17 as shown in FIG. 24.

Second photoresist mask 15 is then removed using well known techniques. Note that a small ridge 14 of HTO layer 8 may remain above field oxide region 4, but is sufficiently small that it does not interfere with later processing steps.

Figure 24:
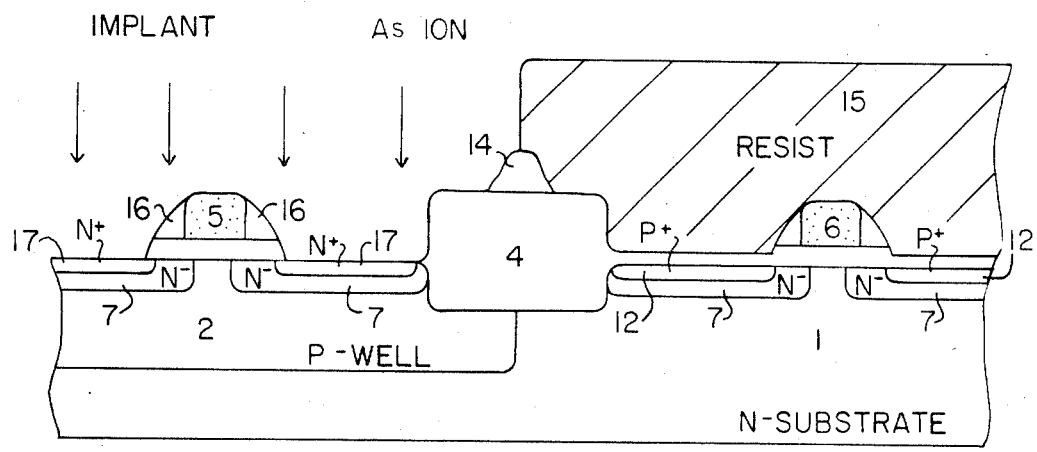
FIG. 24 shows the semiconductor structure of FIG. 23 after N+ source/drain ion implant.
Figure 25:
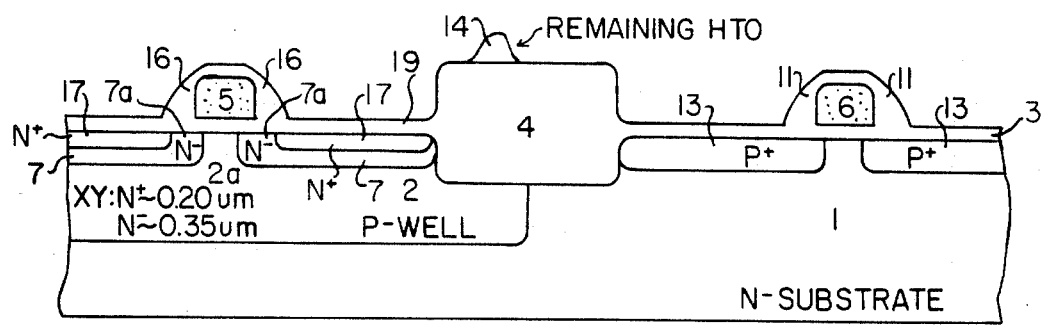
FIG. 25 shows the semiconductor structure of FIG. 24 after removal of the N+ implant mask and source/drain anneal/ oxidation.

After second photoresist mask 15 is removed, the semiconductor structure shown in FIG. 24 is annealed at a temperature of approximately 920° C. in order to diffuse N+ source/drain regions 17 to a depth of approximately 2000 Å as shown in FIG. 25. The junction depth of the N− regions 7 is approximately 3500 Å. Similarly, the junction depth of the P+ source/drain regions 13 is approximately 3500 Å. The semiconductor structure is then oxidized at 920° C. in an atmosphere of oxygen to form oxide layer 19 approximately 500 Å thick as shown in FIG. 25.

The importance of forming a relatively wide sidewall spacer 17 having a width of approximately 4000 to 5000 Å for N channel devices is explained with reference to FIGS. 24 and 25. Due to the shielding effect of spacer 16 during implantation of N+ regions 17, wide spacers 16 provide a separation of the N+ regions 17 from the gate 5 and from the channel region 2a underneath the gate 5 by the lightly doped portions 7a of source/drain regions 7. This lateral separation is necessary in order to reduce hot-electron injection by lowering the peak electric field at the N-channel drain pinch-off region. A high electric field can generate "hot" electrons which overcome the potential barrier between silicon and silicon dioxide These hot electrons can be captured by the traps in the gate oxide which can cause the N channel threshold voltage to shift.

On the other hand, a narrow spacer 11 having a width of approximately 1000 Å to 1500 Å is desirable in P channel devices so that the N− regions 7 (FIG. 24) are completely converted to P+ regions during the annealing and oxidation described above which follow removal of the second photoresist layer 15. Narrow spacers 11 are also required to insure that source/drain region 13 are aligned with or underlap the gate 6 by approximately 100 to 500 Å, for if the source/drain regions 13 do not extend laterally to the respective ends of gate 6, the threshold voltage of a P channel device with gate 6 will have a higher threshold voltage than desirable. By insuring alignment or underlap, the narrow spacers 11 provide a P channel device having a threshold voltage less than 1 volt. Otherwise, the threshold voltage in a P channel device will be greater than approximately 1.5 volts. This is undesirable since it will degrade circuit speed and CMOS device performance.

The above embodiments are meant to be exemplary and not limiting, and various modifications and substitutions will be obvious in light of the above disclosure, to one of average skill in the art without departing from the spirit and scope of the invention.

We claim:

1. The method of forming a semiconductor structure in and on a substrate having an N region and a P region extending to the surface of said substrate, said method comprising:

forming a first gate over a portion of said P region and a second gate over a portion of said N region;

forming a first and a second N− source/drain region in said P region separated by a channel portion of said P region underlying said first gate;

forming a first and a second sidewall spacer having a first selected width abutting the respective ends of said second gate;

forming, using said second gate and said first and second sidewall spacers a a mask, a first and a second P+ source/drain region in said N region separated by a channel portion of said N region underlying said second gate;

forming a third and a fourth sidewall spacer having a second selected width abutting, the ends of said first gate;

forming, using said first gate and said third and fourth sidewall spacers as a mask, a first and a second N+ source/drain region within said first and said second N− source drain regions, respectively;

annealing after forming said first and second P+ source/drain regions and said first and second N+ source/drain regions, wherein said first width is selected to be sufficiently narrow so that after said annealing, said P+ source/drain regions extended laterally at least to the respective ends of said second gate, and wherein said second width is selected sufficiently wide so that after annealing, a portion of said first N− source/drain region underlaps said first gate and separates said first N+ source/drain region from said channel portion of said P region and a portion of said second N− source/drain region underlaps said first gate and separates said second N+ source/drain region from said channel portion of said P region and said N+ source/drain regions are laterally separated from said first gate.

2. The method of claim 1 wherein said substrate is doped with N type dopants, said P region is a P well formed in said substrate and said N region is a portion of said substrate.

3. The method of claim 1 or 2 wherein all of said source/drain regions are formed by ion implantation.

4. The method of claim 3 further comprising forming a third and a fourth N⁻ source/drain region in said N region simultaneously with forming said first and said second N⁻ source/drain region in said P region, wherein said step of forming a first and a second P⁺ source/drain region in said N region is done in said third and said fourth N⁻ source/drain regions in said N region.

5. The method of claim 1 wherein said first selected width is less than said second selected width.

6. The method of claim 3 wherein said first selected width is less than said second selected width.

7. The method of claim 1 wherein the ratio of said first selected width to said second selected width is in the range of 1/5 to ½.

8. The method of claim 3 wherein the ratio of said first selected width to said second selected width is in the range of 1/5 to ½.

9. The method of claim 1 wherein said first selected width is in the range of 1000 Å to 2000 Å and said second selected width is in the range of 4000 Å to 5000 Å.

10. The method of claim 3 wherein said first selected width is in the range of 1000 Å to 2000 Å and said second selected width is in the range of 4000 Å to 5000 Å.

* * * * *